United States Patent [19]

Yang et al.

[11] Patent Number: 4,821,278

[45] Date of Patent: Apr. 11, 1989

[54] INVERTED CHANNEL SUBSTRATE PLANAR SEMICONDUCTOR LASER

[75] Inventors: Jane J. Yang, Los Angeles, Calif.; Chi-Shain Hong, Bellevue, Wash.

[73] Assignee: TRW Inc., Redondo Beach, Calif.

[21] Appl. No.: 33,304

[22] Filed: Apr. 2, 1987

[51] Int. Cl.$^4$ ............................................. H01S 3/19
[52] U.S. Cl. ........................................ 372/46; 372/45
[58] Field of Search ............................. 372/44, 45, 46

[56] References Cited

U.S. PATENT DOCUMENTS 4,647,953  3/1987  Okajima et al. ..................... 372/45

FOREIGN PATENT DOCUMENTS 2129212  5/1984  United Kingdom ................. 372/45

Primary Examiner—William L. Sikes
Assistant Examiner—Georgia Y. Epps
Attorney, Agent, or Firm—James M. Steinberger; Sol L. Goldstein

[57] ABSTRACT

A semiconductor laser structure having the same advantages as a channeled substrate planar laser, but without the difficulties of fabrication associated with this structure. The structure includes a substrate, a planar first cladding layer, a planar active layer, and a second cladding layer in which a mesa region is formed. A blocking layer is formed over the second cladding layer and electrical contact is made through the blocking layer in the region of the mesa. The blocking layer functions to confine current flow in the mesa region and to provide index-guiding of light in the mesa region. Because of its simple geometry, the structure can be conveniently formed using a desirable fabrication process, such as metalorganic chemical vapor deposition (MOCVD). In one disclosed embodiment of the invention, the mesa is broadened to include at least one intermediate ledge on each side of a central pedestal. This reduces the abruptness of the change in effective index of refraction encountered by the laser light, and reduces astigmatism in the resultant beam.

14 Claims, 1 Drawing Sheet

INVERTED CHANNEL SUBSTRATE PLANAR SEMICONDUCTOR LASER

BACKGROUND OF THE INVENTION

This invention relates generally to semiconductor lasers and, more particularly, to semiconductor laser structures providing relatively high output powers. There are a number of applications of semiconductor lasers that require relatively high powers, such as space communications, laser printing, and optical recording. In recent years, much of the development effort in semiconductor lasers has been directed to increasing the power output from lasers in continuous wave (cw) operation.

Basically, a semiconductor laser is a multilayered structure composed of different types of semiconductor materials, chemically doped with impurities to give them either an excess of electrons (n type) or an excess of electron vacancies or holes (p type). The basic structure of the semiconductor laser is that of a diode, having an n type layer, a p type layer, and an undoped active layer sandwiched between them. When the diode is forward-biased in normal operation, electrons and holes combine in the region of the active layer, and light is emitted. The layers on each side of the active layer have a lower index of refraction than the active layer, and function as cladding layers to confine the light in the plane of the active layer. Various techniques are used to confine the light in a lateral direction as well, and crystal facets are located at opposite ends of the structure, to provide for repeated reflections of the light back and forth in a longitudinal direction in the structure. If the diode current is above a threshold value, lasing takes place and light is emitted from one of the facets, in the plane of the active layer.

Various approaches have been used to confine the light in a lateral sense within a semiconductor laser, i.e. perpendicular to the direction of the emitted light within the plane of the active layer. If a narrow electrical contact is employed to supply current to the device, the lasing action will be limited to a correspondingly narrow region, in a process generally referred to as gain guiding. At high powers, gain-guided devices have strong instabilities and produce highly astigmatic, double-peaked beams. For most high-power semiconductor laser applications there is also a requirement for a diffraction-limited beam, i.e. one whose power is limited only by the diffraction of light, to a value roughly proportional to the wavelength of the emitted light divided by the width of the emitting source. Because of the requirement for a diffraction-limited beam, most research in the area has been directed to index-guided lasers. In these, various geometries are employed to introduce dielectric waveguide structures for confining the laser light in a lateral direction, perpendicular to the direction of light emission and generally in the same plane as the active layer.

A useful introduction to these and other considerations in the design of semiconductor lasers can be found in a paper by Dan Botez, entitled "Laser diodes are power-packed," IEEE Spectrum, June, 1985, pp. 43–53. One highly promising technique for achieving high powers and good lateral index-guiding involves the formation of a longitudinal channel in a semiconductor substrate. The substrate, including the channel, is covered with a first cladding layer, then the active layer and the other cladding layer. This channeled substrate planar (CSP) structure provides a high degree of optical absorption to the substrate on both sides of the channel, and therefore discriminates against higher-order modes of oscillation. The CSP laser structure can be fabricated most easily using the liquid-phase epitaxial (LPE) process, but this has practical limitations and should be avoided. First the LPE process is limited in the size of semiconductor wafer that can be handled, so that mass production of the device is limited. Moreover, the LPE process is extremely time-consuming, such that only a single production run may be completed in a typical working day.

In brief, although the LPE process lends itself well to the filling of the channel region, to facilitate the use of a planar active layer, the process has practical limitations, and it would be highly desirable to develop a more attractive alternative approach. The process of metalorganic chemical vapor deposition (MOCVD) can be employed on larger semiconductor wafers and has other advantages, such as a production run time of about two hours, which permits three or four runs per working day. However, MOCVD is unable to form a CSP structure without difficulty, since it is incapable of completely filling the substrate channel, and a non-planar active layer results. In addition, there is usually difficulty in growing the first cladding layer onto the substrate in the channel region. If the material is gallium aluminum arsenide (GaAlAs), and surface oxidation is not totally removed from the substrate surface, the device may have a substantially high threshold current.

Accordingly, there is a need for a semiconductor laser structure with the functional performance of a channeled substrate planar structure, but with the ability to be fabricated with a process other than liquid-phase epitaxy. The present invention is directed to this end.

SUMMARY OF THE INVENTION

The present invention resides in a semiconductor laser structure that may best be characterized as an inverted channel substrate planar (ICSP) laser. The structure of the invention lends itself to fabrication using the metalorganic chemical vapor deposition (MOCVD) process, which provides many advantages over liquid-phase epitaxy.

Briefly, and in general terms, the inverted channel substrate planar semiconductor laser of the invention comprises a planar substrate of semiconductor material of a selected conductivity type, a planar first cladding layer of semiconductor material of the same conductivity type formed over the substrate, a planar active layer of undoped semiconductor material formed over the first cladding layer, and a second cladding layer of semiconductor material of the opposite conductivity type formed over the active layer and having a mesa formed on it. A semiconductor blocking layer is formed over the second cladding layer and has a conductivity type the same as the substrate, and a conductive contact region extends through the blocking layer to contact the mesa formed on the second cladding layer. The blocking layer laterally surrounds the mesa of the second cladding layer and functions both to confine the current to the region of the mesa and to laterally confine lasing to the same region.

In the illustrative embodiment of the invention, the substrate and the first cladding layer are of n type material and the second cladding layer is of p type material.

The blocking layer is also of n type material. Therefore, when the device is for-ward-biased across the active layer, the blocking layer and the second cladding layer form a reverse-biased p-n junction that inhibits the flow of current outside of the mesa region. Moreover, the n type blocking layer has a higher index of refraction than the p type second cladding layer, and forms a negative-index guide to confine the light in a lateral sense.

In accordance with another aspect of the invention, the sides of the mesa region of the second cladding layer are broadened laterally to provide a less abrupt change in effective index of refraction. In the illustrative embodiment, the broadening is accomplished by a two-step etching process, whereby the mesa includes a central pedestal and an intermediate ledge on each side of the pedestal. However, the invention also encompasses structures in which the mesa region includes a larger number of steps, or is tapered continuously over a substantial distance in each direction, approximating the width of the central pedestal of the mesa.

The more gradual change in effective index of refraction provided by the broadened structure further improves the guiding properties of the laser in the lateral direction and results in extremely stable operation in the fundamental lateral mode at high powers. Astigmatism or asymmetry of the lasing region can also be better controlled by appropriate selection of the thickness of the active layer and the second cladding layer.

It will be appreciated from the foregoing that the present invention represents a significant advance in the field of semiconductor lasers for operation at relatively high powers. In particular, the invention provides a semiconductor structure that lends itself easily to fabrication using the metalorganic chemical vapor deposition (MOCVD) process, but retains the advantages of the channeled substrate planar laser. Other aspects and advantages of the invention will become apparent from the following more detailed description, taken in conjunction with the accompanying drawings.

DESCRIPTION OF THE PREFERRED EMBODIMENTS

Figure 1:
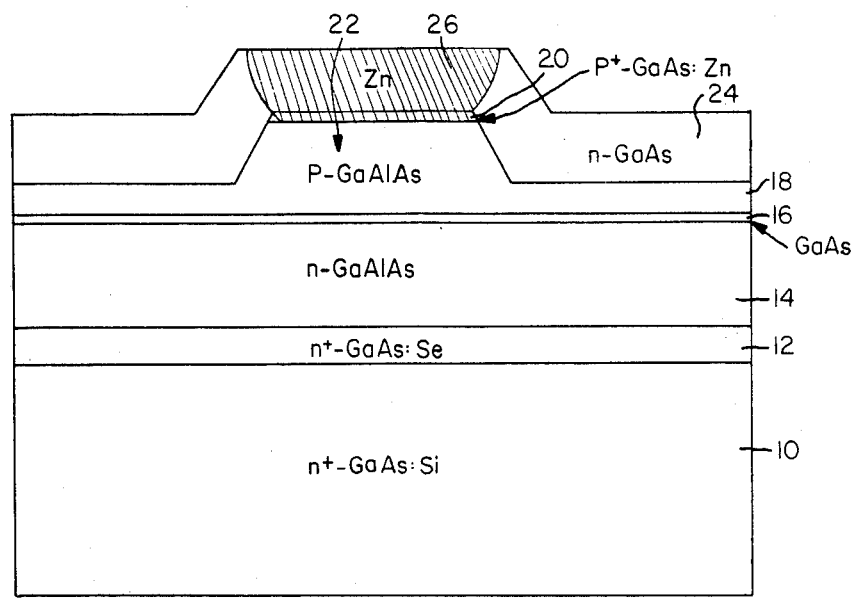
FIG. 1 is a cross-sectional view of an inverted channel substrate planar (ICSP) semiconductor laser structure in accordance with the invention.

As shown in the drawings for purposes of illustration, the present invention is concerned with semiconductor lasers for operation at relatively high power levels. A laser structure known as the channeled substrate planar (CSP) structure provides good lateral confinement of a lasing region but is difficult or impossible to fabricate using modern fabrication technologies, such as metalorganic chemical vapor deposition (MOCVD).

In accordance with the invention, a semiconductor laser is structured in what might best be termed an inverted channel, which is easy to fabricate using MOCVD, but retains the same desirable properties of the channeled substrate planar laser. As shown in FIG. 1, the structure is formed on a semiconductor substrate, indicated by reference numeral 10. In the illustrative embodiment of the invention, the substrate 10 is of n+ type gallium arsenide (GaAs) doped with silicon to a concentration of about $4 \times 10^{18}$. A spacer layer 12 of n+ type gallium arsenide, doped with selenium to a concentration of $4 \times 10^{18}$, is formed over the substrate, and a first cladding layer 14 is formed over the layer 12. The first cladding layer has a thickness of about 1.5 micrometers and is of n type gallium aluminum arsenide (GaAlAs) doped with selenium to a concentration of $1 \times 10^{18}$. Formed over the first cladding layer 14 is an undoped active layer of gallium arsenide, having a thickness of about 500 Angstroms.

Overlying the active layer 16 is a second cladding layer 18 of p type gallium aluminum arsenide, doped with zinc to a concentration of about $5 \times 10^{17}$. A capping layer 20 of p+ type gallium arsenide, doped with zinc, is formed over the second cladding layer 18, and then the cladding layer and the capping layer 20 are selectively etched to form a mesa 22 having a central pedestal and sides that slope down to a planar portion of the layer about 0.3–0.5 micrometers in thickness. A blocking layer 24 of n type gallium arsenide, doped with selenium to a concentration of about $1 \times 10^{18}$, is formed over the entire structure. The blocking layer 24 follows the contours of the mesa region 22 and is of approximately constant thickness, about 1.0 micrometer. Finally, a zinc diffusion region 26 is formed in the blocking layer, extending down into the capping layer 22. Electrical contact is made with the device at the zinc diffusion region 26 and with a metallized surface (not shown) on the underside of the substrate 10.

The blocking layer 24 performs two functions to enhance operation of the laser. First, it forms a blocking p-n junction with the second cladding layer 18, effectively preventing the passage of leakage current from bypassing the mesa region 22 beneath the zinc diffusion region 26. Secondly, the blocking layer provides index-guiding of the light within the structure, and provides highly stable operation in the fundamental lateral mode. The n type blocking layer 24 has a higher index of refraction than the underlying p type second cladding layer 18. Therefore, the effective index of refraction outside the mesa region 22 is higher than the effective index within the mesa region. This arrangement provides lateral index-guiding of light in the device.

The structure of the invention provides the advantages of CSP laser structures, such as high-power operation in a stable fundamental mode, and also the advantages of MOCVD material growth techniques, such as high production yield, the use of relatively large semiconductor wafers, and the provision of a thin active layer for low threshold, high-power applications.

Fabrication of the structure requires a two-step MOCVD or equivalent process. In the first growth step, a planar double heterostructure (DH) is produced, comprising the layers 10, 12, 14, 16, 18 and 20. Then the second cladding layer 18 and the capping layer 20 are selectively etched to define the mesa region 22. In the second growth step, the blocking layer 24 is grown over the structure. The final process step is the formation of the zinc diffusion region 26 for ohmic contact with the device.

Figure 2:
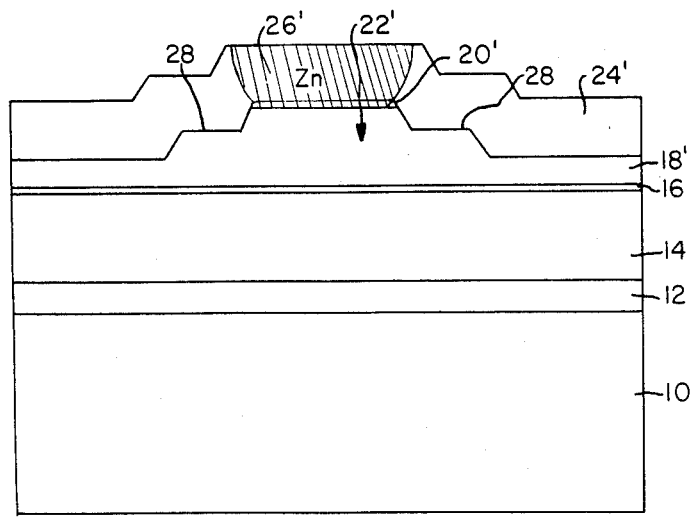
FIG. 2 is a cross-sectional view of an alternate embodiment of the invention.

The other illustrative embodiment of the invention, shown in FIG. 2, differs from the first in that the mesa region, referred to by numeral 22', is broadened laterally by the use of a two-stage etching process. The mesa region 22' in this embodiment includes a ledge 28 on each side of the central pedestal, intermediate in height between the pedestal and the surrounding planar portion of the second cladding layer 18'. The blocking layer 24' follows the general contours of the mesa 22', but the device structure is otherwise identical with that of FIG. 1. Broadening of the mesa region 22' reduces the abruptness in the change in index of refraction from the mesa to the surrounding regions. The effect is analogous to that achieved in a broad-channeled substrate inner stripe (BSIS) laser, which exhibits a small astigmatic distance and stable operation at high powers. The broad area inverted channel substrate planar (BAICSP) laser exhibits the same properties.

The fabrication steps are practically identical to those employed for the structure of FIG. 1, except that the etching process requires two separate steps, one to form a broad mesa and a subsequent etch to define the central pedestal and the intermediate ledges. The broad, first-formed mesa is approximately 6–7 micrometers in width, and the subsequently formed central pedestal is approximately 3.5–4 micrometers wide.

Although the invention has been illustrated and described in the context of a single laser, it will be understood that the principles of the invention apply equally well to arrays of lasers formed in a single substrate. Moreover, although MOCVD is frequently mentioned as the most desirable fabrication process for manufacture of the novel structure, the invention is not limited to this or any other specific fabrication technique.

It will be appreciated from the foregoing that the present invention represents a significant advance in the field of semiconductor lasers. In particular, the invention provides a laser structure that combines the advantages of channeled substrate lasers with the advantages of MOCVD or an equivalent fabrication process. The resulting structure, using an inverted channel or mesa, and a blocking layer to confine current and to guide the light laterally, gives stable fundamental-mode operation at relatively high power levels, on the order of 100 mw (milliwatts). It will also be appreciated that, although two embodiments of the invention have been described in detail for purposes of illustration, various modifications may be made without departing from the spirit and scope of the invention. Accordingly, the invention is not to be limited except as by the appended claims.

We claim:

1. An inverted channel substrate planar semiconductor laser, comprising:
   a planar substrate of semiconductor material of a selected conductivity type;
   a planar first cladding layer of semiconductor material of the same conductivity type formed over the substrate;
   a planar active layer of undoped semiconductor material formed over the first cladding layer;
   a second cladding layer of semiconductor material of the opposite conductivity type formed over the active layer and having a mesa formed on it;
   a semiconductor blocking layer formed over the second cladding layer and having a conductivity type the same as the substrate; and
   a conductive contact region extending through the blocking layer to contact the mesa formed on the second cladding layer;
   whereby the blocking layer laterally surrounds the mesa of the second cladding layer and functions both to confine the current to the region of the mesa and to laterally confine lasing to the same region.

2. An inverted channel substrate planar semiconductor laser as defined in claim 1, wherein:
   the substrate, the first cladding layer, and the blocking layer are of n type material; and
   the second cladding layer is of p type material.

3. An inverted channel substrate planar semiconductor laser as defined in claim 2, wherein:
   the substrate is of silicon-doped gallium arsenide;
   the first cladding layer is of selenium-doped gallium aluminum arsenide;
   the active layer is of undoped gallium arsenide;
   the second cladding layer is of zinc-doped gallium aluminum arsenide; and
   the blocking layer is of selenium-doped gallium arsenide.

4. An inverted channel substrate planar semiconductor laser as defined in claim 3, wherein:
   the conductive contact region is a zinc diffusion region extending through the blocking layer to the second cladding layer.

5. An inverted channel substrate planar semiconductor laser as defined in claim 1, wherein:
   the mesa on the second cladding layer includes a central pedestal and a transition region on each side of the pedestal in which the thickness of the layer is tapered from the height of the pedestal to the height of a surrounding planar area.

6. An inverted channel substrate planar semiconductor laser as defined in claim 5, wherein:
   each transition region adjacent to the central pedestal of the mesa region includes at least one intermediate ledge.

7. An inverted channel substrate planar semiconductor laser as defined in claim 5, wherein:
   each transition region adjacent to the central pedestal of the mesa region is of approximately the same width as the central pedestal.

8. An inverted channel substrate planar semiconductor laser as defined in claim 5, wherein:
   the substrate, the first cladding layer, and the blocking layer are of n type material; and
   the second cladding layer is of p type material.

9. An inverted channel substrate planar semiconductor laser as defined in claim 8, wherein:
   the substrate is of silicon-doped gallium arsenide;
   the first cladding layer is of selenium-doped gallium aluminum arsenide;
   the active layer is of undoped gallium arsenide;
   the second cladding layer is of zinc-doped gallium aluminum arsenide; and
   the blocking layer is of selenium-doped gallium arsenide.

10. An inverted channel substrate planar semiconductor laser as defined in claim 9, wherein:
    the conductive contact region is a zinc diffusion region extending through the blocking layer to the second cladding layer.

11. An inverted channel substrate planar semiconductor laser, comprising:
    a planar substrate of n type gallium arsenide;
    a planar first cladding layer of n type gallium aluminum arsenide formed over the substrate;
    a planar active layer of undoped gallium arsenide formed over the first cladding layer;
    a second cladding layer of semiconductor material of p type gallium aluminum arsenide formed over the active layer;
    a capping layer of p type gallium arsenide formed over the second cladding layer;
    a mesa region formed from the second cladding layer and the capping layer by etching;

a semiconductor blocking layer of n type gallium arsenide formed over the remainder of the second cladding layer and the capping layer; and a conductive contact region extending through the blocking layer to contact the second cladding layer in the mesa region;

whereby the blocking layer laterally surrounds the mesa region of the second cladding layer and functions both to confine the current to the mesa region and to laterally confine lasing to the same region.

12. An inverted channel substrate planar semiconductor laser as defined in claim 11, wherein:

the mesa region includes a central pedestal and a transition region on each side of the central pedestal in which the thickness of the layer is tapered from the height of the pedestal to the height of a surrounding planar area.

13. An inverted channel substrate planar semiconductor laser as defined in claim 12, wherein:

each transition region adjacent to the central pedestal of the mesa region includes at least one intermediate ledge.

14. An inverted channel substrate planar semiconductor laser as defined in claim 12, wherein:

each transition region adjacent to the central pedestal of the mesa region is of approximately the same width as the central pedestal.

* * * * *